(12) United States Patent
Fujii

(10) Patent No.: US 7,358,465 B2
(45) Date of Patent: Apr. 15, 2008

(54) METHOD FOR RESTORING CERAMIC HEATER

(75) Inventor: Hideki Fujii, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 156 days.

(21) Appl. No.: 11/316,892

(22) Filed: Dec. 27, 2005

(65) Prior Publication Data

US 2006/0175320 A1 Aug. 10, 2006

(30) Foreign Application Priority Data

Feb. 4, 2005 (JP) .............................. 2005-029139

(51) Int. Cl.
*H05B 3/16* (2006.01)
*B29C 73/00* (2006.01)

(52) U.S. Cl. ...................... 219/543; 427/140; 427/155; 427/461; 427/471; 427/592; 427/593; 29/592.1; 29/611; 29/620; 156/94; 156/98; 264/36.21

(58) Field of Classification Search ................ 219/543; 156/94, 98; 427/140, 155, 461, 471, 592–3; 29/592.1, 611, 620; 264/36.21
See application file for complete search history.

(56) References Cited

U.S. PATENT DOCUMENTS 5,053,251 A * 10/1991 Hara et al. .................. 427/142
7,094,450 B2 * 8/2006 Nagaraj et al. ............. 427/454

* cited by examiner

*Primary Examiner*—Shawntina Fuqua
(74) *Attorney, Agent, or Firm*—Lowe Hauptman Ham & Berner, LLP

(57) ABSTRACT

A ceramic heater for heating a semiconductor wafer under processing and has a layered structure wherein on one surface of a supporting substrate made of carbon or a carbon-based composite material, successively formed layers including an insulating layer, and electroconductive layer as an electric heating element and a dielectric layer. A first step for partly or completely removing the layer or layers having degraded properties by means of a suitable method such as sandblasting and a second step of re-forming the layer or layers having been removed in the first step. The invention allows for a substantial cost decrease as compared with the conventional way by replacing the worn-out ceramic heater with a newly manufactured one.

10 Claims, No Drawings

METHOD FOR RESTORING CERAMIC HEATER

BACKGROUND OF THE INVENTION

The present invention relates to a ceramic heater for heating semiconductor wafers (the workpiece to be heated), which is used in CVD apparatuses or sputtering apparatuses in the manufacturing process of semiconductor devices, or in an etching apparatus to etch away a thin film, for example.

A semiconductor wafer has to be supported by a fixing means when undergoing certain types of processing or when subjected to microscopic inspection, in order to prevent displacement or falling of the wafer held by a sample holder during the processing or inspection procedure. Mechanical chucks are used in the prior art as a supporting means, and, among them, vacuum chucks are preferred because they have the advantage of never sealing the surface of the sample. However, vacuum chucks cannot be used when the processing or inspection is performed under a reduced pressure or in a vacuum, and this has led to the development of electrostatic chucks (see Japanese Laid-Open Patent Application S52-67353). With an electrostatic chuck, the electrostatic chuck electrode unavoidably keeps a distance from the sample by intervention of an insulating layer.

It is a well known technology that, in the production of semiconductor devices, a polysilicon film, an oxide film, a conductor film, a dielectric film, or the like is formed on the semiconductor wafer with a CVD or sputtering apparatus, or that these thin films are etched with an etching apparatus. This technology requires that the semiconductor wafer (the workpiece under processing) be kept constant at a desired temperature in order to maintain the quality of the formation or etching of the thin films, and requires a heater (ceramic heater) for heating the semiconductor wafer in order to adjust this temperature to be kept constant.

In heating of a semiconductor wafer, the whole surface of the semiconductor wafer must be evenly fixed onto the heater, and an electrostatic attracting device (electrostatic chuck) is used in a reduced pressure atmosphere. As the process temperature is increasing in recent years, the material of the insulating layer is changed from synthetic resins to ceramics. For example, the materials used for the insulating layer include alumina, silica, and magnesia (see Japanese Laid-Open Patent Application S59-124140), as well as pyrolytic boron nitride (see Japanese Laid-Open Patent Application H7-10665).

SUMMARY OF THE INVENTION

During the use thereof, these ceramic heaters rub against the semiconductor wafers (the workpiece being processed), causing exfoliation to occur at the surface layer where the processed workpiece is mounted, or resulting in decreased performance as the electrode (heating element, electrostatic chuck electrode) formed inside the surface layer changes by aging over time. Also, the sputtered metal is deposited onto surfaces other than the mounting surface, and this metal can cause scratching or exfoliation at the surface layer. For these reasons, the heater must be replaced with a new one at suitable intervals. Repairing the heater instead of renewing was out of the question in the past, so that the used ceramic heaters were just discarded, and there were problems in relation to the reservation of resources through recycling, reuse, and other ways.

The present invention was conceived in order to solve the above problems, and provides a method for restoring degraded characteristics of a ceramic heater in which at least one insulating layer is formed on the surface of a supporting substrate made from carbon or a carbon-based composite material, an electroconductive layer is formed on the insulating layer, and at least one dielectric layer is formed on the conductive layer, the method comprising a first step of removing, from the outermost surface, a part or all of the layers formed on the substrate of carbon or a carbon-based composite material, and a second step of re-forming the layer or layers having been removed in the first step on the supporting substrate.

The present invention further provides a method for restoring degraded characteristics of a ceramic heater built in an electrostatic chuck having, on one surface of a supporting substrate of carbon or a carbon-based composite material, a heater-functioning layered structure including a first insulating layer formed on the substrate surface, a first electroconductive layer as a heater element formed on the first insulating layer and a first dielectric layer formed on the first electroconductive layer, and, on the other surface of the supporting substrate, a chuck-functioning layered structure including a second insulating layer formed on the supporting substrate, a second electroconductive layer as the chuck electrode formed on the second insulating layer and a second dielectric layer formed on the second electroconductive layer, in which at least one first insulating layer is formed on one surface of a supporting substrate made of carbon or a carbon-based composite material, an electroconductive layer is formed on said insulating layer, at least one dielectric layer is formed on said conductive layer, and a second insulating layer, said method comprising a first step of removing a part or all of the second layered structure including the outermost layer and a second step of re-forming the second layered structure having been removed in the first step on the substrate surface.

It is preferable that the first step of removal of the layer or layers is conducted by means of sandblasting, water jet, surface grinding, ball end mill, sandpaper, or knife edge, and that a part of the substrate is covered with a masking material so that re-forming of the layers in the second step is limited to the uncovered areas only where re-forming of the layers is in fact due. The masking material is preferably made from graphite, boron nitride, or carbon/carbon-based composite.

It is preferable that the first and the second dielectric layers are formed from aluminum nitride, a mixed body of aluminum nitride and boron nitride, boron nitride, carbon-admixed pyrolytic boron nitride or carbon- and silicon-admixed pyrolytic boron nitride.

In the present invention, all or a part of the degraded layer of a ceramic heater of which the performance has been decreased is removed from the outermost surface thereof, and a layer having the necessary performance is re-formed, without a need of renewal of the ceramic heater. As a result, it is possible to provide a processing method with which the running cost is lower than in the case where the heater is renewed with a new one, so that a solution is provided to the serious problems in recent years for resources reservation by way of recycling and reuse of the material otherwise just to be discarded.

DESCRIPTION OF THE PREFERRED EMBODIMENTS

The inventors have arrived at the present invention on the base of the discovery that the characteristic performance of a degraded ceramic heater could be restored by removing the degraded layer or layers in the first step and by re-forming the layer or layers having been removed in the first step anew in the second step.

The present invention will now be described in detail.

The ceramic heater which is the workpiece for processing in the method of the present invention has a heating element as the first electroconductive layer intervening between the first insulating layer which in turn is formed on one surface of a supporting substrate made from carbon or a carbon-based composite material and the first dielectric layer.

The dielectric layer in a ceramic heater acts as a layer which separates the heating element from the semiconductor wafer, which is under processing with the ceramic heater. In the case of an electrostatic chuck with a built-in ceramic heater, the dielectric layer serves to separate the electrostatic chuck electrode from the semiconductor wafer under processing, and to separate the heating element from the apparatus frame or serves as a heat sink.

In order to increase the chucking force and to reduce generation of particles, the dielectric material constituting the dielectric layer is preferably made of aluminum nitride, a mixture of aluminum nitride and boron nitride, carbon-admixed pyrolytic boron nitride, pyrolytic boron nitride or pyrolytic boron nitride admixed with carbon and silicon.

By taking into consideration the mechanical strength, thermal expansion, and other factors, the insulating layer is reinforced by backing with a layer of carbon or a carbon-based composite material instead of increasing the thickness thereof. Preferable examples of the carbon or the carbon-based composite material include isotropic graphite and carbon fiber-reinforced carbon.

Preferable examples of the material constituting the electroconductive layer serving as the resistance-heating element include pyrolytic graphite and pyrolytic graphite admixed with boron.

Preferable examples of the material constituting the electrostatic chuck electrode layer include pyrolytic graphite and pyrolytic graphite admixed with boron.

Though not particularly limitative depending on the properties of the material of the layer or layers to be removed, the procedure of removing the layers of degraded performance is conducted advantageously by using sandblasting, water jet, surface grinder, ball end mill, sandpaper or knife edge in respects of uniformity in the removal of the layers and little damages on the layers not to br removed in the first step.

Needless to say, even a layer of which the characteristics have not yet been degraded must be removed in the first step if the underlying layer thereof has already been degraded and is due for re-formation because removal of an underlying layer can never be undertaken without removing the upper layer.

In the second step for reformation of the layer having been removed in the first step, a part of the workpiece surface is masked with a masking material to limit the area for the actual re-formation just to the areas where re-formation of the layers is essential. This is because the amount of the layers for removal can be decreased thereby, the yield of acceptable workpieces after removal of the layers can be increased, the time taken for removal of the layers can be shortened leading to a cost decrease and other advantages.

In the following, the method of the present invention is described in more detail by way of Examples and Comparative Examples which, however, never limit the scope of the present invention in any way.

EXAMPLE 1

A ceramic heater having a function of an electrostatic chuck was constructed by successively forming, on a graphite substrate having a diameter of 200 mm and a thickness of 15 mm, an insulating layer of PBN (pyrolytic boron nitride), an electroconductive layer of PG (pyrolytic graphite) and, further thereon, a dielectroc layer of PBN having a thickness of about 100 μm. This ceramic heater was repeatedly used for a long period of time until the chucking performance thereof had become degraded by the loss of the chucking force due to occurrence of so many scratches on the surface to give a test workpiece for working according to the inventive method.

The ceramic heater thus degraded was set on a lathe and, as the first step of the inventive method, an about 50 μm thick surface layer of the PBN dielectric layer was removed by using a cutting bit followed by the second step of the inventive method in which the PBN dielectric layer having been removed in the first step was re-formed by the CVD method.

The ceramic heater obtained by re-formation of the PBN dielectric layer was subjected to an evaluation test of the performance to find that the sample heater worked as satisfactorily as a freshly prepared new ceramic heater.

EXAMPLE 2

The experimental procedure in this Example was substantially the same as in Example 1 described above excepting for the use of a different means for the removal of the damaged PBN dielectric layer which was subjected to sandblasting with alumina particles as the blasting sand. The results of the evaluation test of the thus re-formed ceramic heater were that the performance of the ceramic heater had been restored as completely as in Example 1.

With the present invention, it is possible to decrease the running costs and to extend the service life of a ceramic heater, to be in compliance with the today's requirements for resources reservation by recycling and reuse of worn-out materials. The present invention therefore greatly contributes to the technological field of manufacturing semiconductor devices.

What is claimed is:

1. A method for restoring degraded characteristics of a ceramic heater having a layered structure, on one surface of a supporting substrate made from carbon or a carbon-based composite material, consisting of an insulating layer, an electroconductive layer formed on the insulating layer and a dielectric layer formed on the electroconductive layer, which comprises the steps including:

a first step of partly or completely removing the layered structure including the layer or layers having degraded properties; and a second step of re-forming the layer or layers in the layered structure on the supporting substrate having been removed in the first step.

2. A method for restoring degraded characteristics of an electrostatic chuck with a built-in ceramic heater having, on one surface of a supporting substrate made from carbon or a carbon-based composite material, a first layered structure exhibiting a function of a heating element consisting of a first insulating layer formed on the supporting substrate, a first electroconductive layer to serve as a heating element formed on the first insulating layer and a first dielectric layer formed on the first electroconductive layer and, on the other surface of the supporting substrate, having a second layered structure consisting of a second insulating layer formed on the other surface of the supporting substrate, a second electroconductive layer having a function of an electrostatic chucking electrode formed on the second insulating layer and a second dielectric layer formed on the second electroconductive layer, which comprises the steps including:
- a first step of partly or completely removing the second layered structure including the layer or layers having degraded properties; and
- a second step of re-forming the layer or layers having been removed in the first step.

3. The method for restoring degraded characteristics of a ceramic heater as claimed in claim 1 in which the first step of removing the layered structure is conducted by means of sandblasting, water jet, surface grinding, ball end mill, sandpaper or knife edge.

4. The method for restoring degraded characteristics of an electrostatic chuck as claimed in claim 2 in which the first step of removing the layered structure is conducted by means of sandblasting, water jet, surface grinding, ball end mill, sandpaper or knife edge.

5. The method for restoring degraded characteristics of a ceramic heater as claimed in claim 1 in which the second step of re-forming the layer or layers is conducted on a limited area only by masking the other areas with a masking material.

6. The method for restoring degraded characteristics of an electrostatic chuck as claimed in claim 2 in which the second step of re-forming the layer or layers is conducted on a limited area only by masking the other areas with a masking material.

7. The method for restoring degraded characteristics of a ceramic heater as claimed in claim 5 in which the masking material is selected from the group consisting of graphite, boron nitride, carbon and a carbon-based composite material.

8. The method for restoring degraded characteristics of an electrostatic chuck as claimed in claim 6 in which the masking material is selected from the group consisting of graphite, boron nitride, carbon and a carbon-based composite material.

9. The method for restoring degraded characteristics of a ceramic heater as claimed in claim 1 in which the dielectric layer is formed of a dielectric material selected from the group consisting of aluminum nitride, a blend of aluminum nitride and boron nitride, pyrolytic boron nitride, carbon-admixed pyrolytic boron nitride and carbon- and silicon-admixed pyrolytic boron nitride.

10. The method for restoring degraded characteristics of an electrostatic chuck as claimed in claim 2 in which the dielectric layer is formed of a dielectric material selected from the group consisting of aluminum nitride, a blend of aluminum nitride and boron nitride, pyrolytic boron nitride, carbon-admixed pyrolytic boron nitride and carbon- and silicon-admixed pyrolytic boron nitride.

* * * * *